US006169586B1

(12) United States Patent
Riemann

(10) Patent No.: US 6,169,586 B1
(45) Date of Patent: Jan. 2, 2001

(54) METHOD AND APPARATUS FOR PROGRAMMING A TELEVISION RECEIVER

(75) Inventor: Uwe Riemann, Braunschweig (DE)

(73) Assignee: Deutsche Thomson-Brandt GmbH, Villingen-Schwenningen (DE)

(*) Notice: Under 35 U.S.C. 154(b), the term of this patent shall be extended for 0 days.

(21) Appl. No.: 09/090,080

(22) Filed: Jun. 3, 1998

(30) Foreign Application Priority Data

Jun. 4, 1997 (DE) .............................................. 197 23 290

(51) Int. Cl.⁷ ........................................................ H04N 5/50
(52) U.S. Cl. ............................ 348/731; 348/10; 348/460; 455/161.1
(58) Field of Search .............................. 455/161.1, 161.2, 455/185.1, 186.1; 348/10, 478, 460, 461, 731, 732

(56) References Cited

U.S. PATENT DOCUMENTS

| 5,617,151 | * | 4/1997 | Lee ........................................ 348/731 |
| 5,649,285 | * | 7/1997 | Cautley ................................. 455/6.2 |

FOREIGN PATENT DOCUMENTS

| 3942339 | 6/1991 | (DE) | ................................ H04N 1/00 |
| 4019248 | 12/1991 | (DE) | ................................ H04N 5/44 |
| 4241761 | 3/1994 | (DE) | ................................ H03J 7/18 |
| 0373297 | 6/1990 | (EP) | ............................. H04N 7/087 |
| WO95/26608 | 10/1995 | (WO) | ........................... H04N 7/087 |

OTHER PUBLICATIONS

"No Problems with Transmitter Search" by Dietmar Lerch (8 pg. translation—Funkschau, No. 22 1992.

* cited by examiner

Primary Examiner—Nathan Flynn
Assistant Examiner—Ngoc Vu
(74) Attorney, Agent, or Firm—Joseph S. Tripoli; Robert D. Shedd; David T. Shoneman

(57) ABSTRACT

The method according to the invention is distinguished by the fact that a transmitter identifier (SK) is contained in the received channel (EK), the program locations (P) are assigned once to the received channels (EK), and in the event of a deviation from this assignment, the microprocessor ($\mu$P) controls a search (SL) in order that the desired received channel (EK) is assigned anew to the program location (P).

8 Claims, 3 Drawing Sheets

USER-DEFINED PROGRAMME LOCATION ALLOCATION

1) _ _ _ _ _
2) _ _ _ _ _
3) _ _ _ _ _
4) _ _ _ _ _
 • • •
 • • •

- PLEASE ENTER THE RESPECTIVE PROGRAMME NAME
- PRESS START IN ORDER TO START THE SEARCH

FIG. 5

AUTOMATIC PROGRAMME LOCATION ALLOCATION

NO TRANSMITTER IDENTIFIER IS PRESENT FOR
THE RECEIVED CHANNEL 14

14) _ _ _ _ _

- PLEASE ENTER THE PROGRAMME NAME
- PRESS START IN ORDER TO CONTINUE THE SEARCH

FIG. 6

METHOD AND APPARATUS FOR PROGRAMMING A TELEVISION RECEIVER

FIELD OF THE INVENTION

The invention is based on a method for programming a television receiver according to the preamble of claim 1.

BACKGROUND OF THE INVENTION

Television viewers who operate their receivers from the broadband cable network are often confronted with the situation where the network operator has changed the cable allocation, that is to say the assignment of television programmes and cable channels. This measure is necessary for the network operator whenever he has to change his programme schedule for legal reasons or from the standpoint of media policy. Generally this means that television programmes are withdrawn or added, the current channel allocation having to be modified.

A consequence of this for the television viewer is that he must acquire information about the new channel allocation from daily newspapers or directly from the network operator and then perform renewed programming of his programme locations at the television receiver. This situation is often a source of annoyance for the television viewer since the latter generally learns of the change only when he can no longer find a specific transmitter under the programme location known to him on his remote control. Searching for the desired transmitter is a laborious and time-consuming exercise particularly for television viewers who are not familiar with the programming of memory locations.

The invention is based on the object of providing a simplified method for programming a television receiver.

SUMMARY OF THE INVENTION

The inventive method for programming a television receiver having a tuner, a programme location allocation memory, a transmitter identifier memory, a memory for storing the programmed data and a microprocessor is distinguished by the fact that a transmitter identifier is read out in the received channel, the programme locations are assigned once to the received channels, and in the event of a later change to this assignment, the microprocessor controls a search in order that the desired received channel is assigned anew to the programme location.

The method according to the invention has the advantage that a television receiver only has to be programmed once. If, as already mentioned, the network operator then changes the cable allocation, that is to say the assignment of television programmes and cable channels, renewed programming is not necessary. On the other hand, the fact that the system automatically performs the new programming is also very helpful in the case of satellite or terrestrial reception when the television receiver is transported from one place to the other for example due to a change in residence or a holiday.

The method is furthermore distinguished by the fact that the transmitter identifier is contained in the vertical blanking interval as VPS signal and/or teletext and/or packet code and is read out via the tuner with the aid of the microprocessor.

The transmitter identifier is preferably concomitantly transmitted in the vertical blanking interval since no interference is thus visible in the picture. It is nevertheless conceivable for the transmitter identifier also to be transmitted together with the picture.

The method is also distinguished by the fact that before the very first programming operation, the programme location allocation is defined and then during the search the received channels are assigned to the programme locations defined in this way.

Here there is the advantage that unlike what is customary at present, the search does not store one channel after the other in the television receiver and the user then has to perform reprogramming such that he assigns his desired order to the transmitters in the course of programme location allocation. In this case, it is possible firstly to specify at which programme location position the corresponding transmitter is desired and then to start the search. This is very advantageous since then the programming occurs from the beginning in the mind of the user.

In addition, it is possible in this way to perform presetting during production of the television set, with the result that a standard transmitter order is proposed to the user who consequently does not have to perform this work. It is furthermore conceivable to allocate a plurality of standard programme location options from which the user can then make a selection.

For example:
1st programme location allocation:
programme location 1—ARD,
programme location 2—ZDF,
programme location 3—N3, etc.
2nd programme location allocation:
programme location 1—Pro7,
programme location 2—RTL,
programme location 3—SAT1, etc.
3rd programme location allocation:
programme location 1—Children's Channel
programme location 2—Cartoon Network,
programme location 3—SUPER RTL, etc. The user can then choose the range of programme location assignments which he likes best, e.g. according to the programmes offered.

Finally, the method is distinguished by the fact that if a received channel does not have a transmitter identifier, the user is requested to control the search manually.

It is advantageous here that it is noted that no transmitter identifier is present and the television then transfers manual control to the user.

An inventive television receiver having a tuner, a programme location allocation memory, a transmitter identifier memory, a memory for storing the programmed data and a microprocessor is distinguished by the fact that means are provided which read out the transmitter identifier of the received channel, which assign the programme location once to the received channel, and, in the event of a later change to this assignment, the microprocessor controls a search in order that the desired received channel can be assigned anew to the programme location.

The television receiver is also distinguished by the fact that the means are designed in such a way that they read out the transmitter identifier, which is contained in the vertical blanking interval as VPS signal and/or teletext and/or packet code, via the tuner with the aid of the microprocessor.

The television receiver is furthermore distinguished by the fact that the means are designed in such a way that they have stored the programme location allocation before the very first programming operation and then during the search assign the received channels to the programme locations defined in this way.

Finally, the television receiver is distinguished by the fact that if a received channel does not have a transmitter identifier, these means cause the user to be requested to control the search manually.

In the following explanations, a further method is described which always ensures the same programme location allocation even when there is a change in the received channels. An essential part of the idea is a periodic interrogation of the received channels from the television receiver. For this purpose, the tuner of the television receiver sweeps across the entire band with an automatic search and carries out a momentary demodulation of the signal for each received channel. The demodulated signal is thereupon forwarded to the microprocessor which, on the basis of the transmitter identifier contained in the transmitter, identifies the received channel, for example ARD, ZDF or RTL.

The microprocessor then knows the current assignment of programme location allocation and received channels and can store the data found in a memory. The microprocessor compares this table with a programme location allocation defined by the user and, consequently, can always assign the received channel to the specific programme location. The microprocessor then compares the programme location allocation with the currently received channel and sets the tuning frequency of the tuner to the relevant channel.

The search is intended expediently to be carried out in a phase in which the television receiver is in the standby mode. Furthermore, it should alternatively be possible to update the programme location allocation by pressing a button. This option may be expedient particularly for portable television receivers since the latter are frequently operated at changing sites. It should be noted here that the above-described method is not only suitable for operation from cable networks but also is advantageous primarily for terrestrial reception and satellite reception.

If, after a site change, the received channel desired by the user should not be found during the search, it is possible for a corresponding message to appear on the screen requesting the user to choose a different programme since the desired programme location allocation cannot be effected for the non-received channel. The procedure may be similar when, during a search, new received channels have been found for which the user has not yet set up a programme location previously. In this case, the message could direct an enquiry to the user as to whether to ignore the new received channel or include it in the user table.

BRIEF DESCRIPTION OF THE DRAWINGS

The invention is explained below with reference to the drawings, in which:

FIGS. 4–6 show menu images for the television receiver according to the invention.

DETAILED DESCRIPTION OF THE PREFERRED EMBODIMENTS

Figure 1:
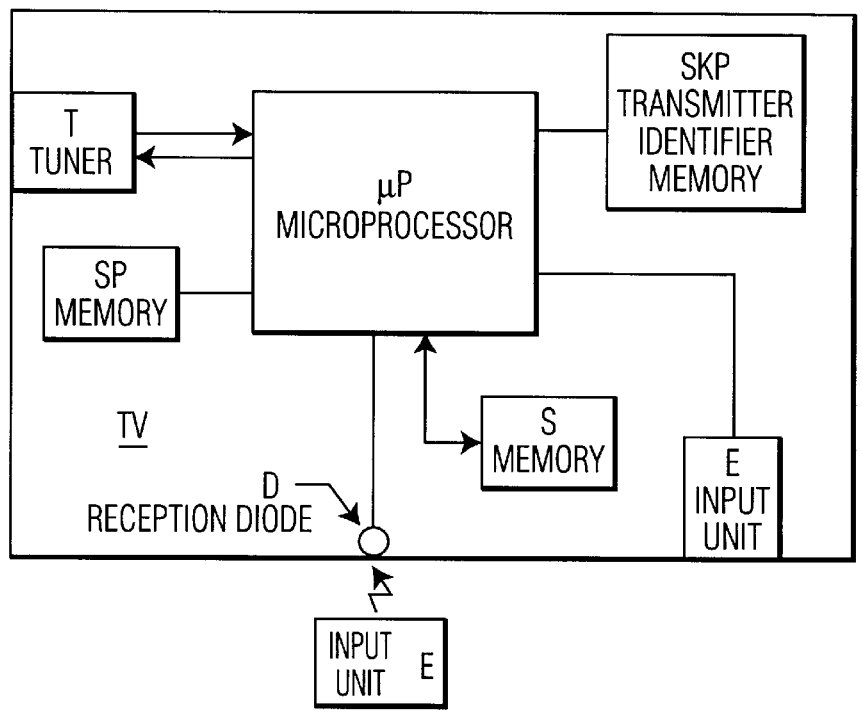
FIG. 1 shows a block diagram of a television receiver configured according to the invention.

FIG. 1 shows a block diagram of the television according to the invention. The tuner T, the microprocessor $\mu P$, the memory S, the input unit E and the reception diode D are illustrated. The input unit, as illustrated, may be situated directly on the television receiver or be designed as a remote control. Furthermore, a memory SP is present which contains the automatic programme location allocation, that is to say the programme location allocation predetermined by the manufacturer. Furthermore, a transmitter identifier memory SKP is present in order to implement a transmitter identification. Stored in this memory are the patterns from which the microprocessor can implement the transmitter identification. For example, if it finds a code 017 in the case of the VPS signal, it can use the transmitter identifier memory SKP to perform a comparison and ascertain that, for example, the VPS code 017 corresponds to the ZDF transmitter identifier.

If a programme is then received via the tuner, the microprocessor handles the cooperation between the different memories. First of all, the transmitter that is concerned is established by means of the transmitter identifier memory SKP. The programme location which is to be assigned to the currently received transmitter is subsequently established in the programme location allocation memory SP. This information is subsequently stored in the memory S. It is also possible for the memory S to be integrated in the programme location allocation memory SP by the currently received channel being assigned in a simple manner to the programme location allocation.

It is also conceivable for the transmitter identifier memory SKP to be assigned to the programme location allocation memory SP in which, for example, the transmitter identifier 017 is stored under programme location 2. If the microprocessor then contains the transmitter identifier from the received channel, it only has to perform a comparison there.

The individual blocks of the memories may also be contained in a single memory in which only the memory areas are separate in each case. In addition, the transmitter identifier memory may have stored for one programme a plurality of transmitter identifiers, for example ZDF, VPS code 017, teletext 031 or packet code 27. The numbers are chosen arbitrarily. It should be noted that there are fixedly defined assignments for each transmitter which are allocated only where a transmitter appears for the first time, but are not changed otherwise. For this reason, this method can be implemented in an advantageous manner because when a new transmitter is added, this is noticed and the corresponding code can be added to the memories, so that this does not have to be constantly repeated.

Figure 2:
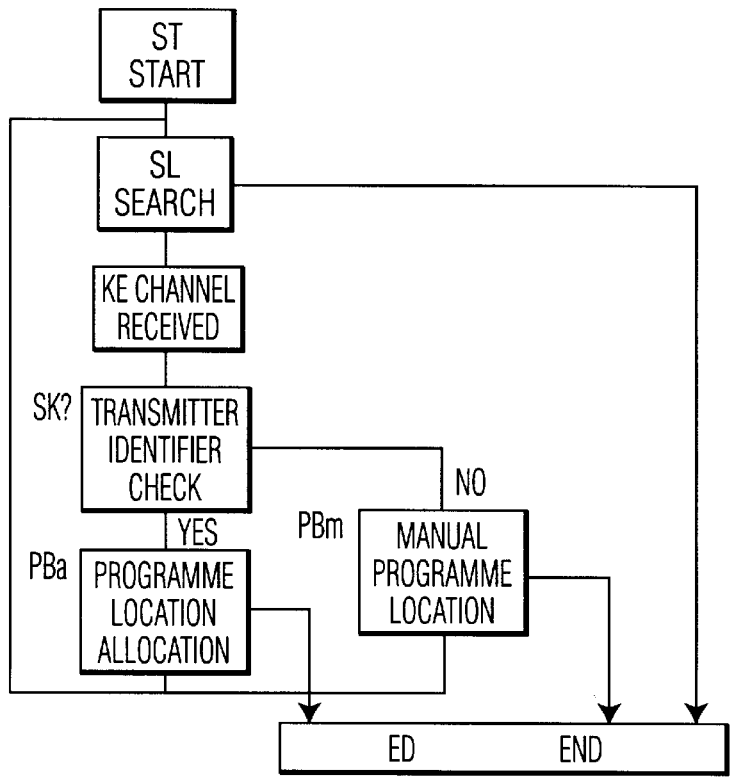
FIGS. 2, 3 show flow diagrams for the television receiver according to the invention.

FIG. 2 shows a flow diagram for automatic programme location allocation. When the user chooses the menu item automatic programme location allocation, the program starts by start ST. The search SL then begins. If the search has completely run through, the end ED of the program is reached. If a channel is received KE, it is used to implement a transmitter identifier check SK?. If a transmitter identifier SK is present, the automatic programme location allocation PBa is carried out. If a transmitter identifier SK is not present, manual programme location allocation PBm is carried out. If a programme location allocation has taken place, either manually or automatically, for all of the programmes, the end ED of the program is thus also reached. If this is not the case, the program begins again before the search SL.

Figure 3:
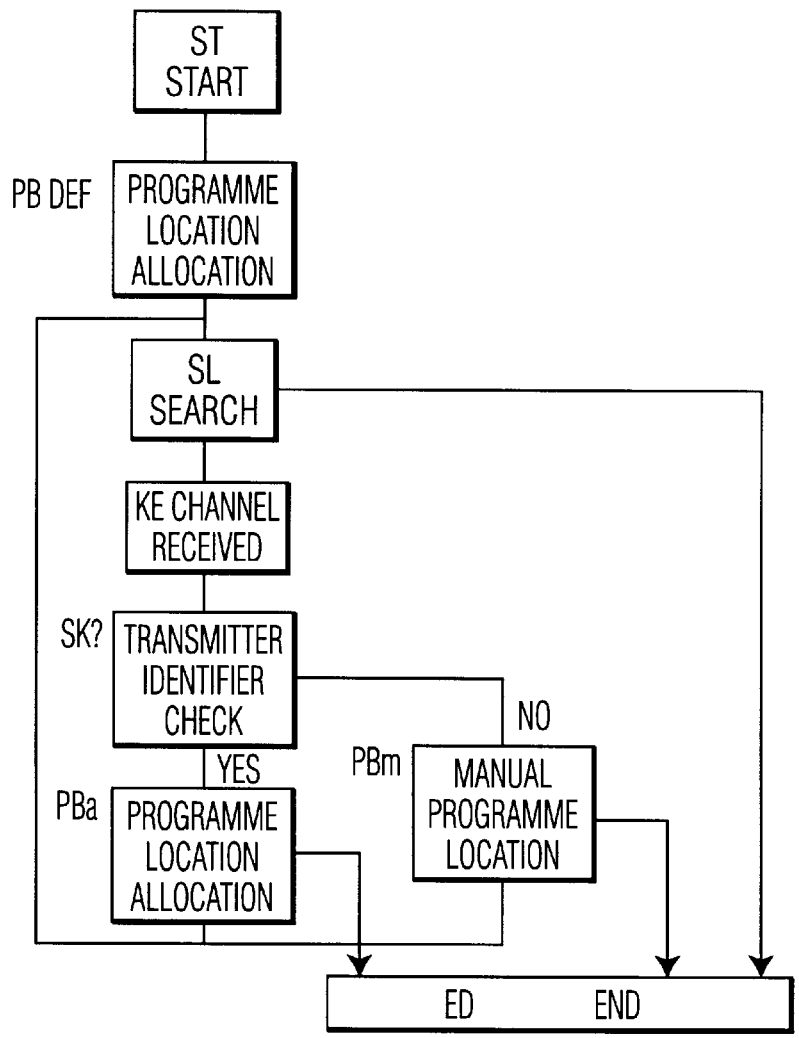

FIG. 3 shows a user-defined programme location allocation. A difference from FIG. 2 is only evident in that after starting ST of the program, the user must define the programme location allocation PB DEF. This serves the purpose that the user can freely define the programmes in his desired order.

Figure 4:
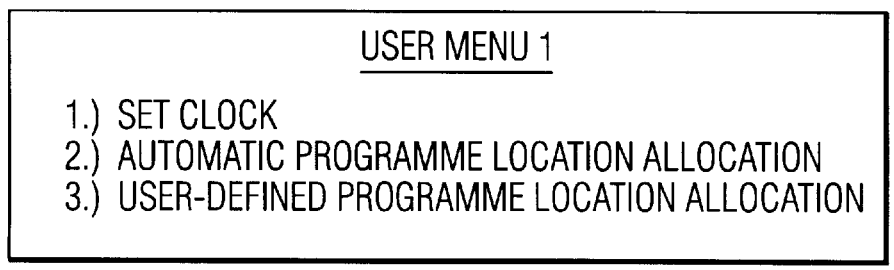

FIG. 4 shows a menu image which is called up either during initial installation or at the pressing of a button by the user. Using the number keys (not illustrated here) 1, 2 or 3, the user can then select the various menu items 1—set clock, 2—automatic programme location allocation, and 3—user-defined programme location allocation.

FIGS. 5 and 6 in each case show the display in which the key 2 or 3 is pressed.

FIG. 5 shows user-defined programme location allocation in which the user is requested to assign the programme name, also called transmitter name, to the respective programme locations. This could be done, for example, by means of an alphanumeric keyboard (not illustrated here) or the user could be given a list containing the names (not illustrated here) of the various programme location providers, from which he can then make a selection as to which programme location he assigns to which programme.

It is also possible to provide one or two keys (not illustrated here) with alphanumeric characters which, by multiple actuation, make it possible to move up or down the character sequence of the alphabet, and the corresponding letter is selected by means of a confirmation key.

It is also conceivable for the programme names to be displayed on the screen by means of window technology (not illustrated here) and for the user to be able to shift the name to the corresponding programme location using a type of cursor. In this case, the name is in practice shifted from the list to a corresponding programme location. When the user has allocated the corresponding programmes to the programme locations, the search can then start by pressing of the key Start (not illustrated here).

FIG. 6 shows automatic programme location allocation. In this specific case, the channel 14 has no transmitter identifier. The user is then requested to allocate a programme name manually since none is present automatically. The search can be continued by pressing of the key Start (not illustrated here).

The invention can be applied to any type of broadcast receiver having the properties according to the invention, even though only the television receiver has been discussed here.

What is claimed is:

1. Method for programming a television receiver having a tuner, a programme location allocation memory, a transmitter identifier memory, a memory for storing the programmed data and a microprocessor, wherein a transmitter identifier is read out in the received channel, the programme locations are assigned once to the received channels, and in the event of a later change to the assignment, the microprocessor controls a search in order that the desired received channel is assigned anew to the programme location.

2. Method according to claim 1, wherein the transmitter identifier is contained in the vertical blanking interval as a VPS signal or a teletext signal or a packet code and is read out via the tuner with the aid of the microprocessor.

3. Method according to claim 1, wherein before the first programming operation, the programme location allocation is defined and then during the search the received channels are assigned to the programme locations defined in this way.

4. Method according to claim 1, wherein if a received channel does not have a transmitter identifier, user is requested to control the search manually.

5. Television receiver comprising a tuner, a programme location allocation memory, a transmitter identifier memory, a memory for storing the programmed data, a microprocessor, and means for reading out the transmitter identifier of the received channel, and for assigning the programme location once to the received channel, and in the event of a later change to the assignment, the microprocessor controls a search in order that the desired received channel can be assigned anew to the programme location.

6. Television receiver according to claim 5, wherein the transmitter identifier is contained in the vertical blanking interval as a VPS signal or a teletext signal or a packet code, and the means for reading out the transmitter identifier reads out the transmitter identifier via the tuner with the aid of the microprocessor.

7. Television receiver according to claim 5, wherein the means for assigning the programme location stores the programme location allocation before the first programming operation and during the search assigns the received channels to the programme locations (P) defined in this way.

8. Television receiver according to claim 5, wherein if a received channel does not have a transmitter identifier, the means for reading out the transmitter identifier and for assigning the programme location provides to a user a request to control the search manually.

* * * * *